(12) United States Patent
Yoshie

(10) Patent No.: US 6,917,092 B2
(45) Date of Patent: Jul. 12, 2005

(54) WIRING STRUCTURE HAVING A SLIT DUMMY

(75) Inventor: Toru Yoshie, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/627,948

(22) Filed: Jul. 28, 2003

(65) Prior Publication Data

US 2004/0202847 A1 Oct. 14, 2004

(30) Foreign Application Priority Data

Jul. 26, 2002 (JP) ........................................ 2002-218878

(51) Int. Cl.[7] .............................................. H01L 29/00
(52) U.S. Cl. ...................... 257/506; 257/508; 257/510; 257/513; 257/524
(58) Field of Search ................................ 257/506, 508, 257/510, 524, 513, 520

(56) References Cited

U.S. PATENT DOCUMENTS 5,094,973 A * 3/1992 Pang ........................... 438/424
5,539,240 A * 7/1996 Cronin et al. ................ 257/520
5,602,423 A   2/1997 Jain ............................ 257/752

FOREIGN PATENT DOCUMENTS

| JP | 10-299085 | 8/1988 |
| JP | 06-318590 | 11/1994 |
| JP | 08-213397 | 8/1996 |
| JP | 09-008039 | 1/1997 |
| JP | 2001-267318 | 9/2001 |

* cited by examiner

Primary Examiner—Cathy F. Lam
(74) Attorney, Agent, or Firm—Volentine, Francos & Whitt

(57) ABSTRACT

A wiring structure includes wiring embedded in an insulating layer. A plurality of slit dummies each of that spaced each other are formed in the wiring. The wiring has a first portion that has a width wider than a reference width, and has a second portion that has a width shallower than the reference width. A distance of each slit dummy is less than a width of the reference width. The slit dummies are not formed in the second portion of the wiring.

17 Claims, 10 Drawing Sheets

US 6,917,092 B2

WIRING STRUCTURE HAVING A SLIT DUMMY

CROSS REFERENCE TO RELATED APPLICATION

The present application claims priority under 35 U.S.C. §119 to Japanese Patent Application No. 2002-218878, filed Jul. 26, 2002, which is herein incorporated by reference in their entirety for all purposes.

BACKGROUND OF THE INVENTION

1. Field of the Invention

The present invention relates to a wiring structure that has a plurality of slit dummies in a wiring.

2. Description of the Related Art

Recently, copper is used as a wiring material to reduce the resistance of the wiring. The wiring with copper is typically fabricated by a damascene process.

The conventional damascene process is shown in FIG. 10.

A silicon nitride film 204 is formed on a semiconductor substrate 202 and a silicon oxide film 206 is formed on the silicon nitride film 204 as shown in FIG. 10(A). Grooves 208a and 208b are formed in the silicon oxide film 206 as shown in FIG. 10(B). Then, a copper layer is formed on the silicon oxide layer 206 including the groove as shown in FIG. 10(C). Since the copper layer is formed, the groove is embedded by the copper layer. The copper layer on the insulating layer is removed by CMP (Chemical Mechanical Polishing) process as shown in FIG. 10(D). That is the copper layer is only remained in the grooves, and the remaining copper layer is used as the wiring. Because copper has a high diffusion rate in some dielectrics, particularly silicon dioxide, some form of barrier layer between the insulating layer and copper layer is required. Various barrier materials have been proposed including refractory metals such as titanium (Ti), tantalum (Ta).

The damascene process has a problem that a thickness of the wiring is reduced during the CMP process.

As shown in FIG. 10(D), a concave portion called dishing is formed in the surface of the wiring. The FIG. 10(D) shows a cross-section at the width direction of the wiring. A depth D of a portion that is deepest at the dishing is increased, while the width of the wiring is increased.

FIG. 2 is a plot of an experimental data that shows a relationship between the width of the wiring W and a variation of a sheet resistance ΔR. In FIG. 2, a horizontal axis is the width of the wiring W μm and a vertical axis is the variation of the sheet resistance ΔR %, while a height of the wiring is 500 nm. According to the plot, the ΔR is 5 or 6% when the W is 2 μm, the ΔR is 20% when the W is 10 μm and the ΔR is 25% or more when the W is 20 μm. That is, while the width of the wiring is increased, a difference between an actual resistance of the wiring and a resistance in design is increased.

In order to solve above problem, (1) a reference width is defined and (2) when a width of the wiring exceed the reference width, slit dummies are used.

The slit dummies are formed in the wiring to prevent the dishing. The slit dummies are used a different material from the wiring. The slit dummies are fabricated at the step of forming the grooves as shown in FIG. 10(B). During the grooves are formed in the silicon oxide film 206 by etching the silicon oxide film 206, the slit dummies are also formed in the silicon oxide film 206 by etching. That is, the slit dummies are made from the material to the silicon oxide film 206.

FIG. 11 is a schematic diagram of a conventional wiring structure with slit dummies.

The copper wiring 222 is formed in the silicon oxide film 216 and a bottom of the copper wiring 222 is formed on a silicon nitride film 218. Slit dummies 214 are formed in the copper wiring. Heights of the slit dummies 214 are equal to a height of the copper wiring 222. However, there is no clear standard in a length Dw and a length Dd of the slit dummy. Therefore, since too many slit dummies are formed in the wiring, a total width of the wiring is increased.

Accordingly, in an object of the present invention, a wiring structure for arranging slit dummies efficiently is provided.

SUMMARY OF THE INVENTION

According to one aspect of the present invention, there is provided a wiring structure that includes a wiring embedded in an insulating layer. A plurality of slit dummies each of that spaced each other are formed in the wiring. The wiring has a first portion that has a width wider than a reference width, and has a second portion that has a width shallower than the reference width. A distance of each slit dummy is less than a width of the reference width. The slit dummies are not formed in the second portion of the wiring.

DETAILED DESCRIPTION OF THE PREFERRED EMBODIMENTS

Figure 1:
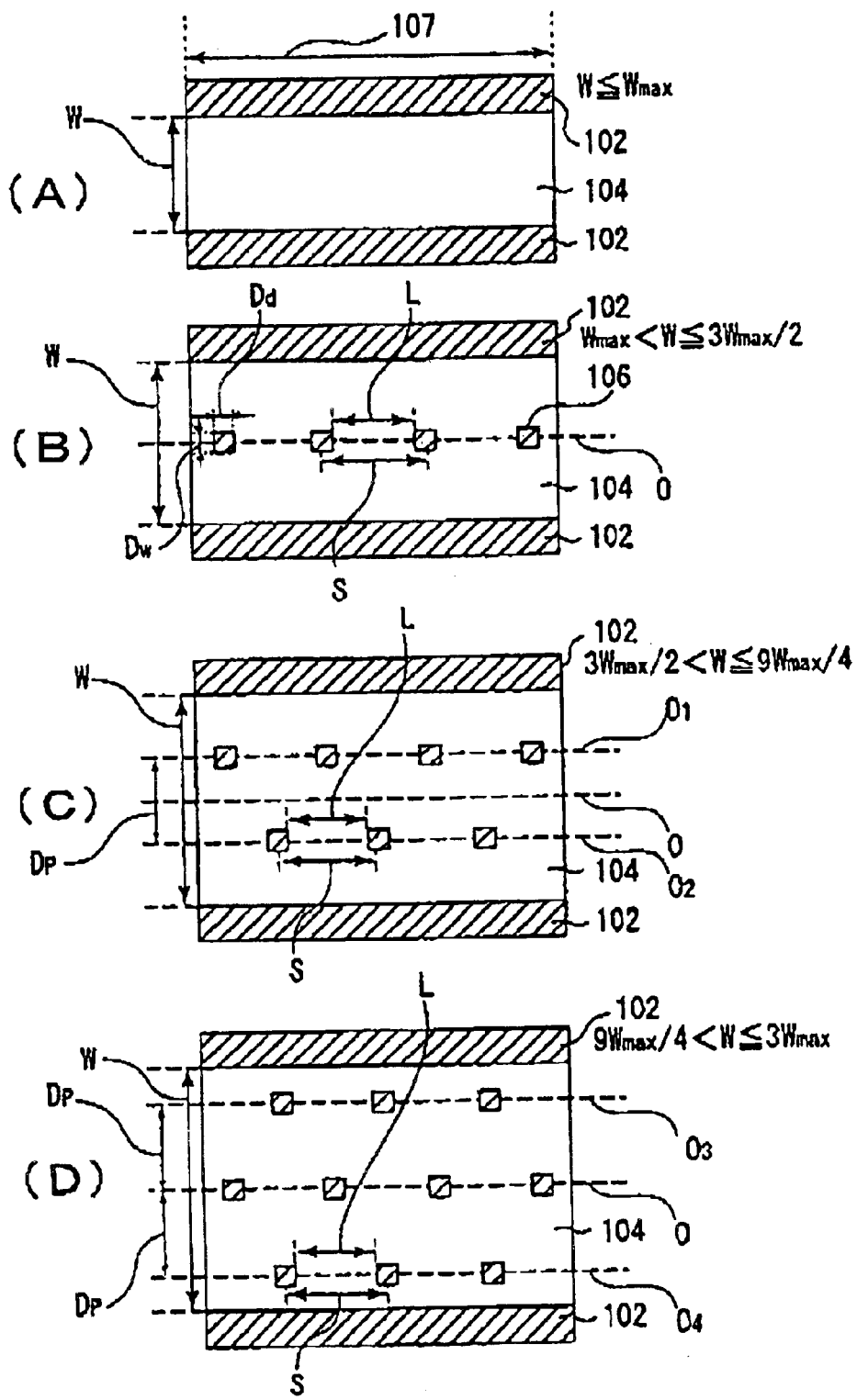
FIG. 1 is a schematic diagram showing an arrangement of the slit dummy of the first preferred embodiment.
Figure 2:
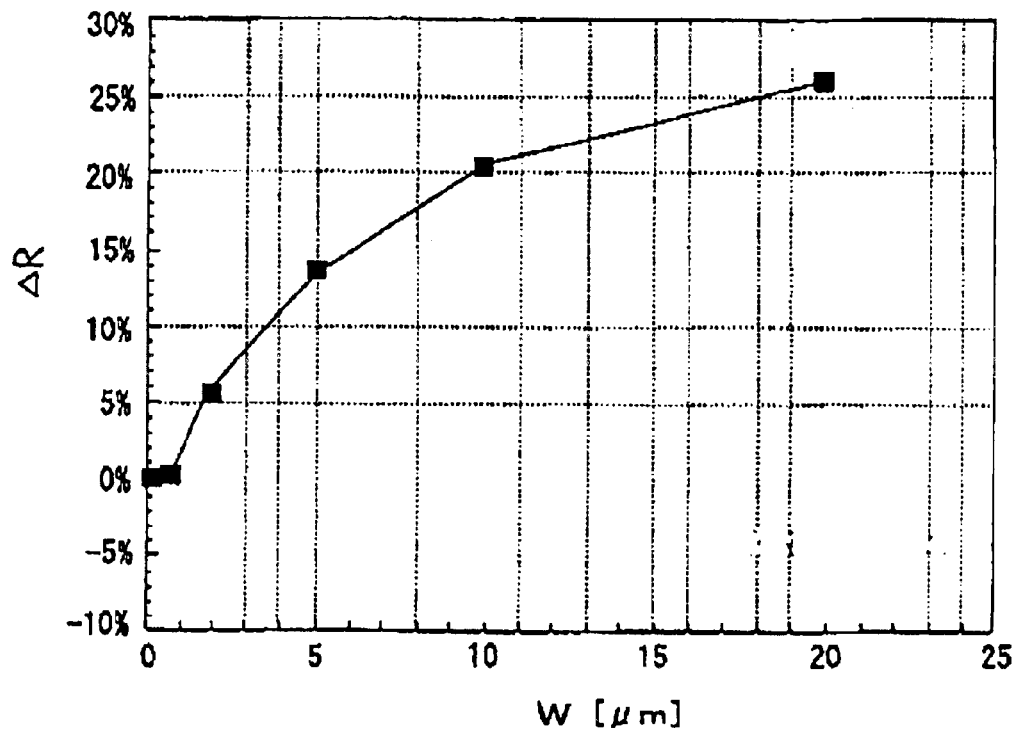
FIG. 2 is a plot showing a relationship between the width of the wiring and the variation of the sheet resistance.

A wiring structure according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Figure 3:
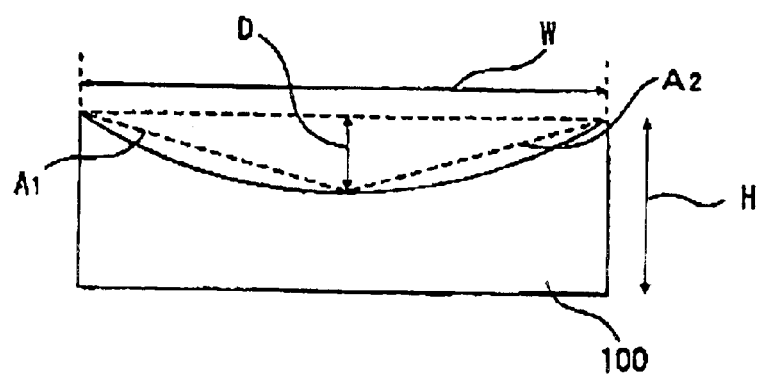
FIG. 3 is a cross-sectional view of the wiring with dishing.

FIG. 3 is a cross-sectional view at a width direction of a wiring that is formed a dishing. As shown in FIG. 3, a isosceles triangle that includes a base that is passing through starting points of a dishing and an apex that is deepest point of the dishing is defined. Since a form of a dishing showing in FIG. 3 approximates lines A1 and A2, a variation of a sheet resistance ΔR, a width of the wiring, a height of the wiring and a depth of the dishing are satisfied a following approximate expression (1).

$$\Delta R \approx HW/(HW-WD/2)-1$$

Figure 4:
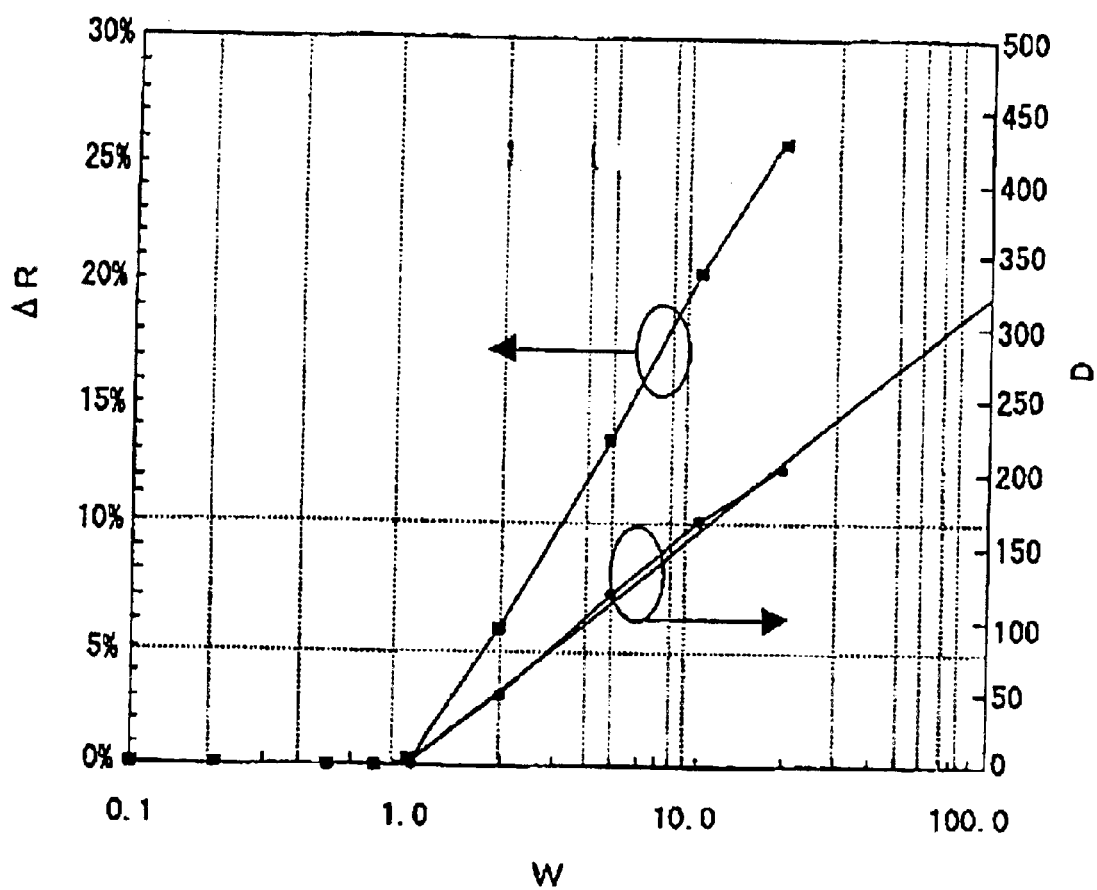
FIG. 4 is a plot showing a relationship between the width of the wiring and the variation of the sheet resistance, and a relation ship between the width of the wiring and the depth of the dishing.

FIG. 4 is a plot showing a relationship between the width of the wiring W and the variation of the sh WD/2)

$$\therefore D=2H\Delta R/(\Delta R+1) \quad (1)$$

A unit of the height of the wiring H and the depth of the dishing D is nm, and a unit of the width of the wiring W is μm.

The depth of the dishing D while the wiring has a height of 500 nm is calculated from the approximate expression (1) and the variation of the sheet resistance ΔR, and a relationship between a width of the wiring W and the depth of the dishing in the height of the wiring is 500 nm. A horizontal axis shows a naturalized logarithm and a vertical axis shows the variation of the sheet resistance ΔR with a unit % and the depth of the dishing D with a unit nm.

As shown in FIG. 4, since a relationship between the naturalized logarithm value of the width of the wiring W and depth of the dishing D shows a line shape, following approximate expression (2) is formed.

$$D \approx 701 \, nW \quad (2)$$

A unit of the depth of the dishing D is nm, and a unit of the width of the wiring W is μm.

Generally, a variation of the resistance is controlled in a range of 3 to 10%. In the first preferred embodiment, a maximum variation of the resistance is defined a value of 5%. That is, a reference width Wmax that the slit dummies are not necessary is calculated from the approximate expressions (1) and (2).

$$701n(Wmax)=2H*0.05/1.05$$

$$\therefore Wmax=Exp(H/735) \quad (3)$$

A unit of the reference width Wmax is μm and a unit of the height of the wiring H is nm.

While the width of the wiring W exceeds the reference width Wmax, the slit dummies are inserted in the wiring. While the width of the W is narrower than the reference width Wmax, the slit dummies are not necessary.

For example, the height of the wiring H is 300 nm, the reference width Wmax is calculated as follows.

$$Wmax(H=300 \, nm)=Exp(300/735)=1.5 \, \mu m$$

Therefore, the maximum width of the wiring is 1.5 μm. While the width of the wiring exceeds 1.5 μm, the slit dummies are used.

It is desired that minimum numbers of the slit dummies are arranged in the wiring evenly. In this embodiment, the same material of the silicon oxide film 102 forms the slit dummies.

FIG. 6(A) shows an arrangement of the slit dummies 106a through 106d. All of the wiring area is included in a distance R, which defined by half of the Wmax, from a side of the slit dummy.

A shape of the slit dummy is square Wmin on a side. The Wmin is a minimum size of fabrication. The side of the slit dummy is arranged in parallel to the long direction of the wiring.

First, the slit dummies 106a and 106b are arranged on a centerline of the long direction of the wiring. The centerline is arranged at middle of the width of the wiring. Each of the slit dummies 106a and 106b have a distance L from each other.

Middle points of each side of the slit dummies 106a and 106b are defined as M1 and M2. Two circles each of that has a radius R and the central pints M1 and M2 have intersections B1 and B2. A point C1 is arranged at a distance R from the pint B1 in the width direction of the wiring. A point C2 is arranged at a distance R from the point B2 in the width direction of the wiring. The slit dummies 106c and 106d are arranged on a line passing through the points C1 and C2. The points C1 and C2 are arranged at middle point of facing sides of the slit dummies 106c and 106d.

FIG. 6(B) through FIG. 6(D) shows a variation of the arrangement of the slit dummies.

If the points C1 and C2 are arranged in the silicon oxide film 102, or arranged on line of the boundary between the wiring 104 and the silicon oxide film 102, the slit dummies 106a and 106b are arranged in the wiring 104 without the slit dummies 106c and 106d, as shown in FIG. 6(B).

If the points C1 and C2 are arranged across the silicon oxide film 102 and the wiring 104, a distance Dh between the edge of the wiring 104 and the points C1 or C2 are size of width direction of the slit dummies 106c and 106d, as shown in FIG. 6(C).

As shown in FIG. 6(D), if the slit dummies 106c and 106d contacts to the edge of the wiring 104, the square Wmin on the side of slit dummies 106a, 106b, 106c and 106d are arranged in according to above rules.

Figure 5:
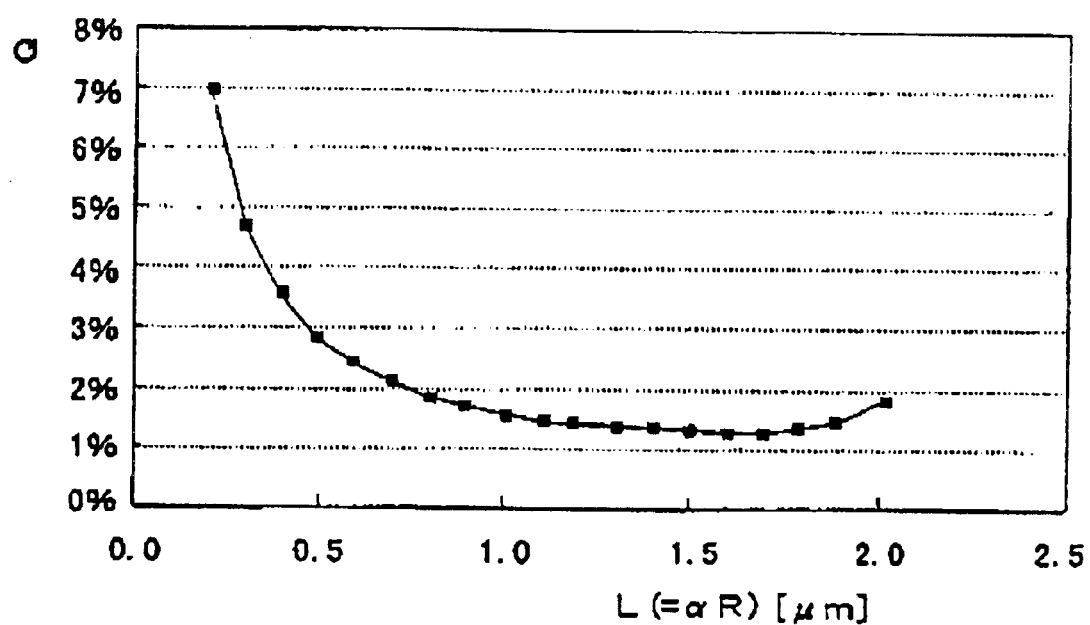
FIG. 5 is a plot showing a relationship between the space of the slit dummies and area ratio of the slit dummies.

FIG. 5 is a plot that shows a relationship between a distance of the slit dummies L and an area ratio Q of the dummies in the wiring, when the reference width Wmax is 2 μm and the width of the slit dummy Wmin is 0.2 μm. The distance of the slit dummies L is defined by αR, the α is a factor for exchanging to the R. The distance between the slit dummies L is shown in horizontal axis with a unit μm, and the area ratio Q of the dummies in the wiring is shown in vertical axis with a unit %.

The area ratio Q of the dummies in the wiring is a value that the total area of the slit dummies Sd per unit area Sp is divided by the unit area Sp.

Since the width of the slit dummies are vanishingly, the unit area Sp is calculated the space L by the width W. Therefore, the area ratio of the slit dummies in the unit area is an area ratio of the slit dummies in the total area of the wiring.

A case of the width is 3.6 μm shows as follows. The total area of the slit dummies Sd is varied in accordance with the distance between the slit dummies L. The total area of the slit dummies Sd in the unit area Sp is calculated as follows.

(a) 0.2<L≦1.2: A number of slit dummies are one.
Sd=Wmin*Wmin (b) 1.2<L<1.6: A number of slit dummies are three.
Sd=Wmin*Wmin+Wmin*Dh*2

(c) 1.6≦L≦2.0: A number of slit dummies are three.
Sd=Wmin*Wmin*3

The area ratio of the slit dummies Q is calculated by dividing the total area of the slit dummies Sd by the unit area Sp.

$$Q=Sd/Sp$$

The area ratio of the slit dummies Q plotted in the vertical axis shows an average of the area ratio of the slit dummies of a plurality point of the width. The area ratio of the slit dummies is averaged of the wiring width of 2.1 μm to 4.2 μm at every 0.1 μm.

In the relationship between the α and the Q shown in FIG. 5, when the distance between the slit dummies L is √3R, the area ration of the slit dummies becomes minimum. That is, the area ratio of the slit dummies Q becomes 1.3%.

While the length in the length direction of the wiring of the slit dummy is Dd, the length Dd is shown as Dd=(S−L) based on the pitch of the slit dummies S and the space of the slit dummies. That is, the pitch S satisfied Dd<S≦2R+Dd. Therefore, the expression (S−L)<S≦2R+Dd is formed.

The pitch of the slit dummies S is usable as equal to the space L of the slit dummies, when the arrangement of the slit dummies is defined. That is, the following description about the arrangement of the slit dummies is described by using the pitch of the slit dummies S.

A rule of arrangement of the slit dummies in the wiring shows as follows.

Step 1: The reference width Wmax is calculated from the variety of the sheet resistance.

Step 2: The pitch S of the slit dummies is defined by the expression S=√3/2Wmax.

Step 3: The rule of arrangement of the slit dummies.

These steps are described in FIG. 1(A) to FIG. 1(C).

The slit dummies are arranged along the long direction of the wiring with the pitch S, when the width W is wider than the reference width Wmax.

Figure 6:
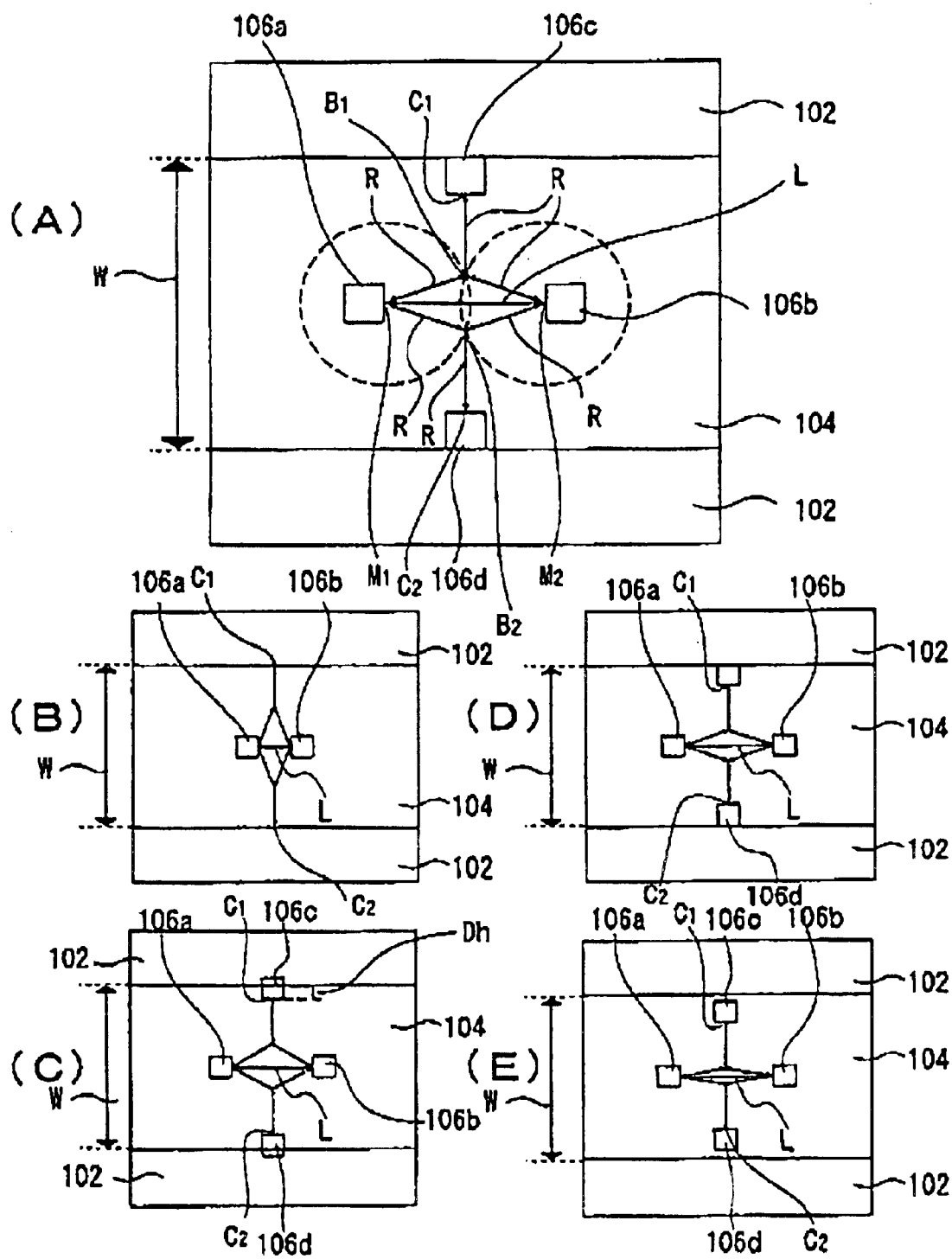
FIG. 6 is a schematic diagram showing the parameter of arrangement of the slit dummies.

When the pitch S is √3/2Wmax, a distance between the adjacent slit dummies lines Dp is 3 Wmax/4 by the rules defined in FIG. 6.

The arrangement of the slit dummies 106 is defined by following rules in the width W.

(a) W≦3Wmax: The slit dummy is not used as shown in FIG. 1(A).

(b) Wmax<W≦Wmax/2: The slit dummies 106 are arranged. Each of the slit dummies is arranged on the middle line O with an even pitch S (S=√3/2Wmax, as shown in FIG. 1(B).

(c) 3 Wmax/2<W≦9 Wmax/4: Each of the slit dummies is arranged on lines O1 and O2. The lines O1 and O2 are located at equal spaces (3 Wmax/8) from the middle line O of the wiring. The slit dummies arranged on the line O1 is half pitch staggered to the slit dummies arranged on the line O2, as shown in FIG. 1(C).

(d) 9 Wmax/4<W≦3 Wmax: The slit dummies are arranged on three lines O, O3 and O4. The line O is a middle line of the wiring, and the lines O3 and O4 are located at equal spaces (3 Wmax/4) from the middle line O. The slit dummies arranged on one line is half pitch staggered to the slit dummies arranged on the next line, as shown in FIG. 1(D).

When four or more slit dummy lines are needed, the slit dummies are arranged as follows. In the following rules, the numbers of the slit dummy lines n are four or more.

When the even number of the slit dummy line is used, two slit dummy lines are arranged at the distance 3 Wmax/8 from the middle line O as shown in FIG. 1(C), and the other slit dummy lines are arranged at the distance 3 Wmax/4 from the next slit dummy line. The slit dummies arranged on one line is half pitch staggered to the slit dummies arranged on the next line.

When the odd number of the slit dummy line is used, one slit dummy line is arranged on the middle line O as shown in FIG. 1(D), and the other slit dummy lines are arranged at the distance 3 Wmax/4 from the next slit dummy line. The slit dummies arranged on one line is half pitch staggered to the slit dummies arranged on the next line.

In order to the steps described above, the rule of arrangement of the slit dummy lines is defined.

According to the first preferred embodiment, the slit dummies are arranged appropriately. That is, a reducing of the area of the wiring causing to introduce the slit dummies in the wiring is reduced. Further, since the slit dummies are used, the dishing causing the CMP process is reduced. As a result, the variation of the resistance of the wiring is reduced.

Second Preferred Embodiment

Figure 7:
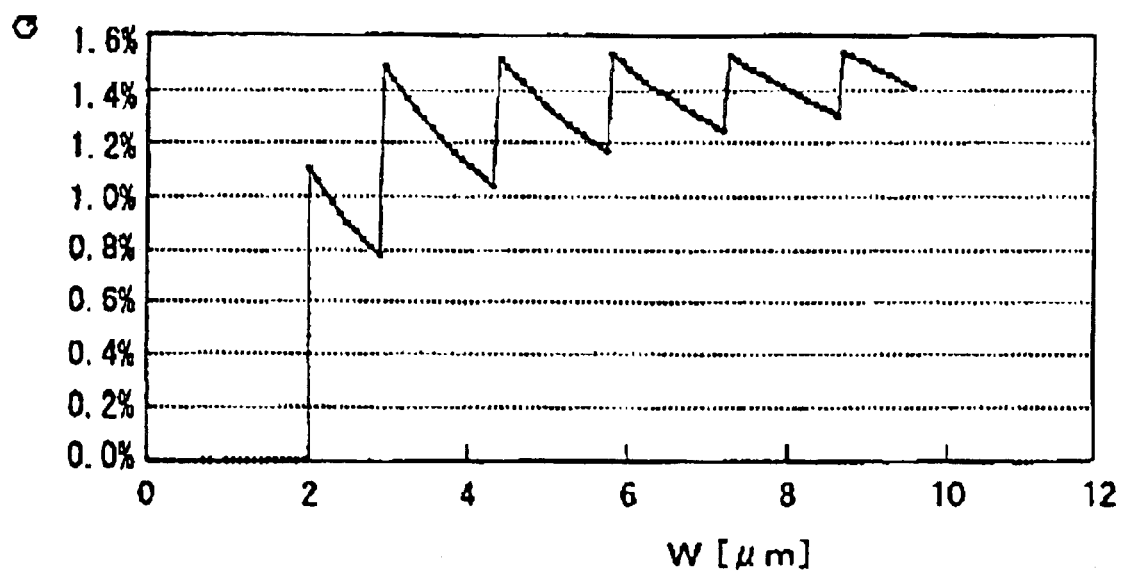
FIG. 7 is a plot showing a relationship between the width of the wiring and the area ratio of the slit dummies.

FIG. 7 is a plot showing a relationship between the area ratio Q % of the slit dummies and the width W μm of the wiring, when the slit dummies are arranged in the rule defined in the first preferred embodiment. In the rule of the first preferred embodiment, since the area ratio Q of the slit dummies is not constant to the width W of the wiring, an actual resistance of the wiring is different from a designed resistance of the wiring.

In order to the plot of FIG. 7, the area ratio of the slit dummies Q in the wiring has a small value that 0.7% to 1.6%. When the width of the wiring W is wide for example the width is 100 μm or more, the slit dummies are polished during the CMP process. As a result, controlling the dishing in the wiring is difficult.

In the second preferred embodiment, the area ratio of the slit dummies Q is 15% to 30%.

In the basic arrangement of the slit dummies 106, the slit dummies are arranged on the middle line O of the width of the wiring. An increased area of the wiring is defined as a wiring area that is removed a width of 3 Wmax/8 from each side of the wiring.

Then, the arrangement of the slit dummies is defined, so as to the slit dummies are included in the increased area of the wiring with a ratio of 20%.

Detailed rules are shown in following steps.

Figure 8:
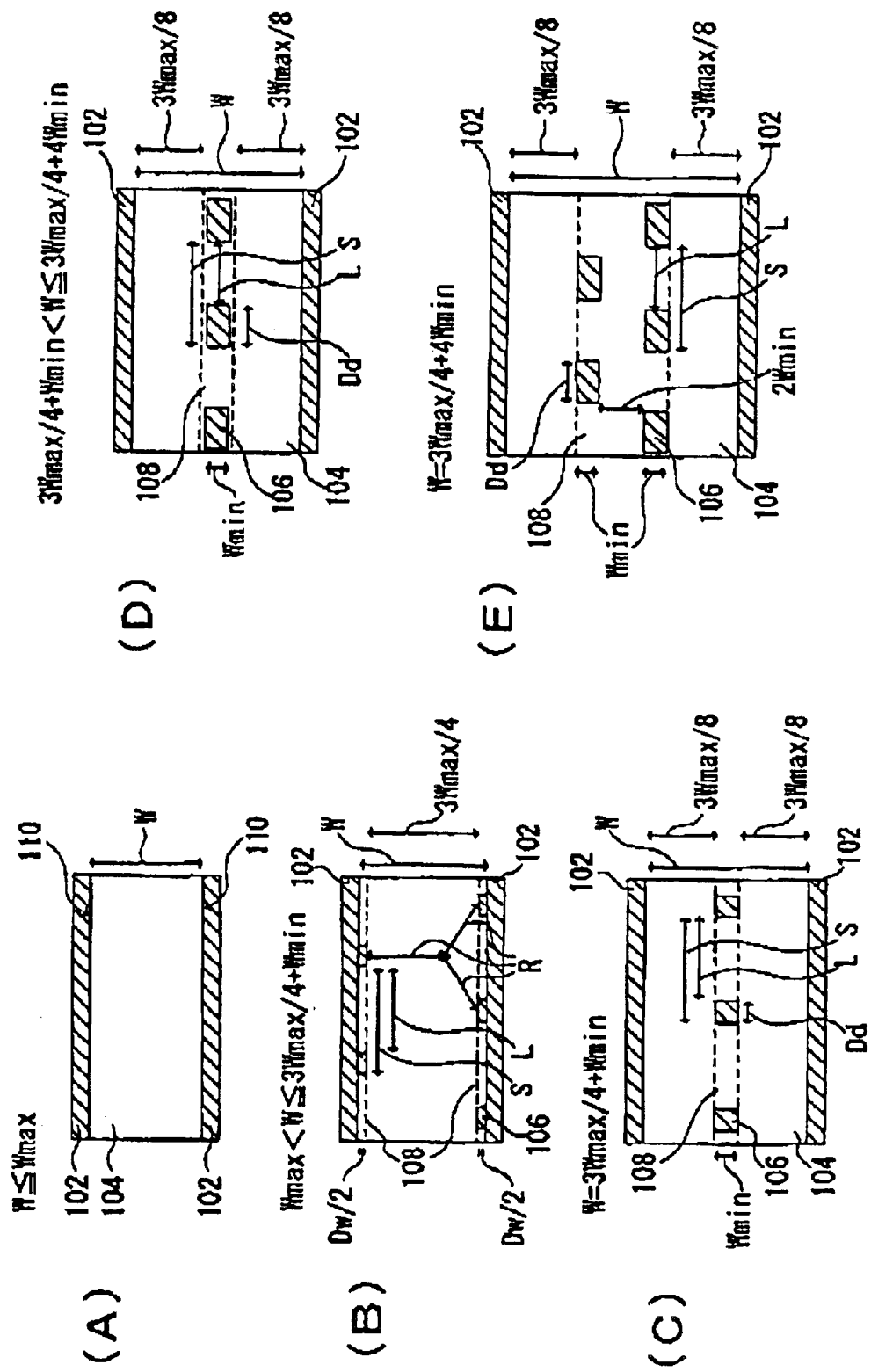
FIG. 8 is a schematic diagram showing the arrangement of the slit dummies in the second preferred embodiment.

(a) W≦Wmax: The slit dummy is not used as shown in FIG. 8(A). When the wiring includes a plurality of wiring lines, each of the wiring lines are arranged at an area ratio of 80%, for preventing the dishing.

(b) Wmax<W≦3 Wmax/4+Wmin (FIG. 8(B)): A length of the slit dummy in the long direction of the wiring is Dd, and a length of the slit dummy in the width direction of the wiring is Dw. The length Dd is $0.2*\sqrt{3/2}$ Wmax. Since the slit dummies are formed in the increased area of the wiring 108 with the area ratio of the wiring in a unit area of the increased area of 20%, the length Dw is smaller than the Wmin. Since the slit dummies area arranged on the middle line in the long direction of the wiring, it is not fabricated desired size. Two slit dummies having a width of half of Dw and a length of $0.2*\sqrt{2/3}$Wmax are arranged at edge of the wiring. When the Wmin is smaller than ¼ Wmax, the slit dummy is not used.

In the following description of the arrangement of the slit dummies, the length Dw is the minimum size of fabrication Wmin. The pitch S is $\sqrt{3/2}$Wmax. (c) W=3 Wmax/4+Wmin: The slit dummy having a length Dd of $(0.2*\sqrt{3}$ Wmax/2 is arranged on the middle line of the wiring, as shown in FIG. 8(c).

(d) 3 Wmax/4+Wmin<W≦3 Wmax/4+4 Wmin: The slit dummy having a length Dd of $(\sqrt{3}$ Wmax*(W−3 Wmax/4)*0.2)/Wmin is arranged on the middle line of the wiring, as shown in FIG. 8(d).

(e) W=3 Wmax/4+4 Wmin: In this condition, the length Dd of the slit dummy is $0.8*\sqrt{3/2}$ Wmax, and the pitch achieves 80%. When the length Dd of the slit dummy is longer than the $0.8*\sqrt{3/2}$ Wmax, the wiring may be divided by the slit dummy. Therefore, when the length Dd of the slit dummy exceeds the length of $0.8 *\sqrt{3/2}$Wmax, the slit dummy is divided in two parts and the slit dummies are arranged on two lines. The slit dummies that is arranged on one line is half pitch staggered to the slit dummies arranged on the other line, as shown in FIG. 8(E).

If the slit dummies are arranged on number of line at $2^k$(k is an integer of k≧2), the slit dummies are arranged as follows.

When the width of the wiring W is achieves every W=3 Wmax/4+$2^{(k+1)}$ Wmin (k is natural number), the slit dummies arranged one line is divided by two lines. Therefore, the slit dummies are arranged in the increased area at area ratio of 20%.

According to the second preferred embodiment, the slit dummies are arranged in the wiring at area ratio of approximately 20%. As a result, the dishing is reduced and the actual resistance of the wiring is near the designed resistance of the wiring.

Third Preferred Embodiment

In the third preferred embodiment, when the wiring has a width that is wider than the reference width Wmax, the wiring is formed by combination of units of the slit dummy pattern. The unit of the slit dummy pattern includes a wiring area and a slit dummy in the wiring area, and the area ratio of the slit dummy is 20%.

In the third preferred embodiment, the unit of the slit dummy pattern has the width of the wiring W. A design freedom is lost, but a step for designing the slit dummies is reduced.

Figure 9:
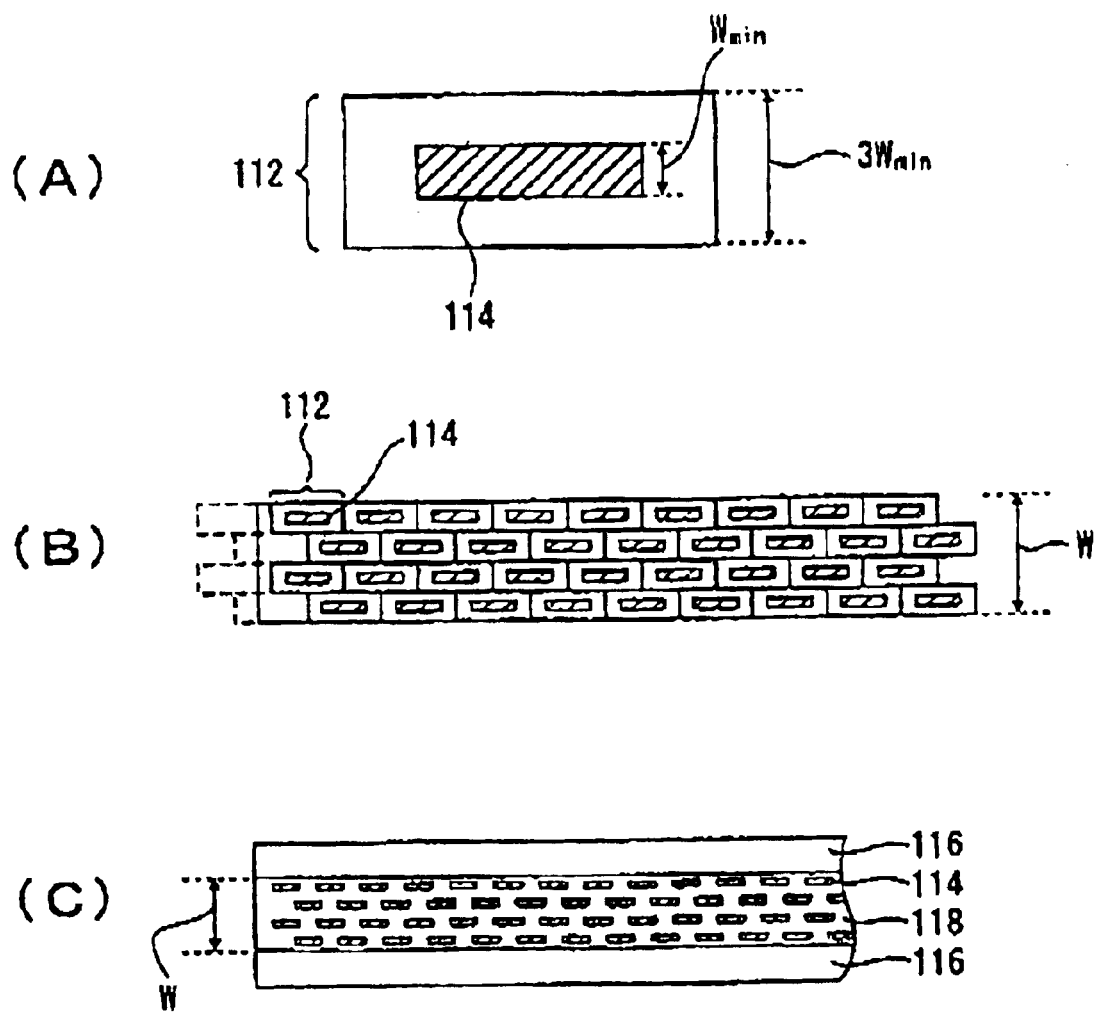
FIG. 9 is a schematic diagram showing the third preferred embodiment.
Figure 10:
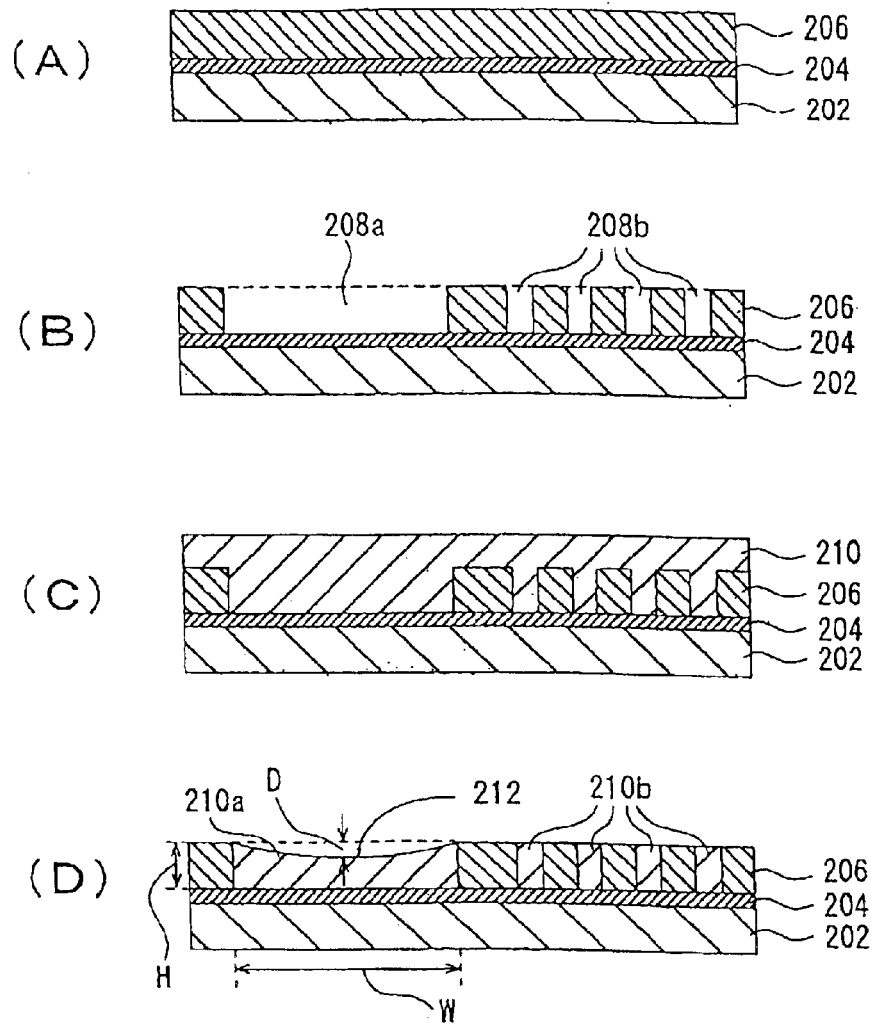
FIG. 10 is a schematic diagram showing the conventional wiring process steps using a damascene process.
Figure 11:
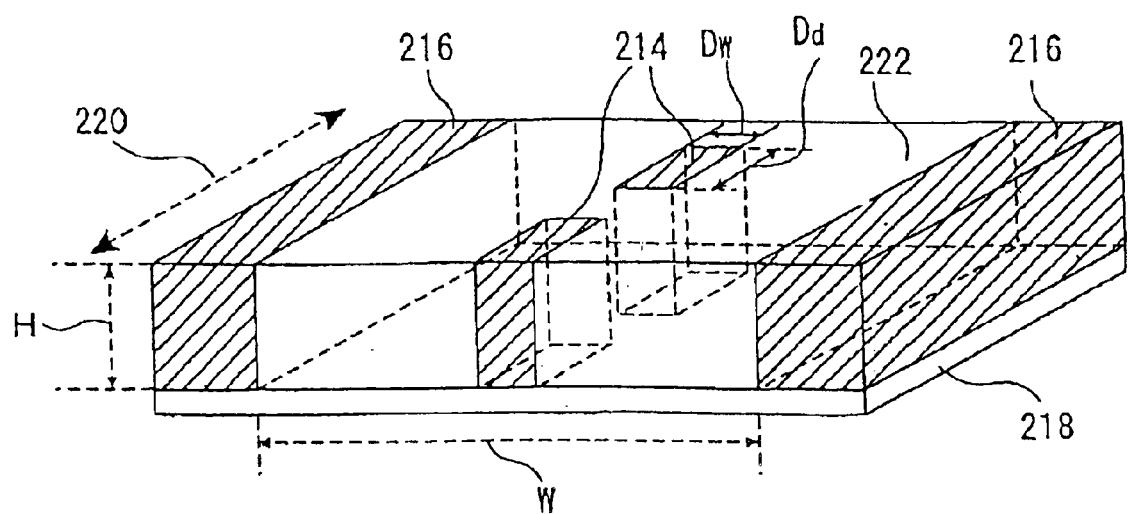
FIG. 11 is a schematic diagram showing the wiring structure that is inserted the slit dummies.

FIG. 9(A) shows the unit slit dummy pattern 112. A width of the unit slit dummy pattern 112 is 3 Wmin. The unit of the slit dummy pattern has a slit dummy 114 that has a width of Wmin and an area ratio of 20%. The units of the slit dummy pattern arranged in line define a line pattern. When the width of the wiring W is 12 Wmin, four line patterns are arranged in contact with each other. The unit of the slit dummy pattern that is arranged on one line is half pitch staggered to the unit of the slit dummy pattern that is arranged on next line, as shown in FIG. 9(B).

If the width of the wiring is n times of the width of the unit of the slit dummy pattern, n lines of the unit of the slit dummy pattern are arranged in contact with each other. The unit of the slit dummy pattern that is arranged on one line is half pitch staggered to the unit of the slit dummy pattern that is arranged on next line, as shown in FIG. 9(B).

In the end in long direction of the wiring, when the unit slit dummy pattern is crossed the boundary of the unit of the slit dummy pattern, the slit dummy is not inserted.

In the third preferred embodiment, the copper wiring has slit dummies that are evenly arranged is fabricated, as shown in FIG. 9(C).

According to the third preferred embodiment, it is easy to design the layout of the wiring that includes the slit dummies.

While the preferred form of the present invention has been described, it is to be understood that modifications will be apparent to those skilled in the art without departing from the spirit of the invention. The scope of the invention is to be determined solely by the following claims.

What is claimed is:

1. A wiring structure comprising:
   an insulating layer including a groove;
   a plurality of slit dummies each of which is spaced from each other in the groove; and
   a wiring which is formed in the groove, the wiring having a thickness H (nm) and a width W ($\mu$m) that is larger than a maximum width Wmax ($\mu$m), wherein the maximum width Wmax is calculated from the following equation, Wmax=Exp (H/735);
   wherein a distance L between the slit dummies is less than the maximum width Wmax.

2. A wiring structure according to claim 1, wherein the slit dummies are arranged in a line and arranged along a direction in which the wiring extends.

3. A wiring structure according to claim 2, wherein the slit dummies are arranged spaced equally.

4. A wiring structure according to claim 1, wherein the slit dummies are arranged in a plurality of lines, and wherein the slit dummies in the plurality of lines are arranged in staggered form.

5. A wiring structure according to claim 4, wherein the slit dummies are arranged spaced equally.

6. A wiring structure according to claim 5, wherein the slit dummies arranged in one of the lines are arranged adjacent to the edge of the wiring.

7. A wiring structure according to claim 1, wherein a distance between the slit dummies is approximately $\sqrt{3}/2$ of the maximum width Wmax.

8. A wiring structure according to claim 1, wherein a distance between slit dummies is approximately 85% of the maximum width Wmax.

9. A wiring structure according to claim 1, wherein a material of the slit dummies is the same as that of the insulating layer.

10. A conductive pattern structure comprising:
    a semiconductor substrate;
    an insulating layer formed on the semiconductor substrate, the insulating layer having a groove;
    a conductive pattern formed in the groove of the insulating layer, the conductive pattern having a thickness H (nm) and a width W ($\mu$m) that is larger than a maximum width Wmax ($\mu$m), wherein the maximum width Wmax is calculated from the equation, $$Wmax=Exp(H/735); \text{ and}$$

a plurality of split dummies formed in entire thickness of the conductive pattern, the slit dummies being formed of an insulating material and being separated by a distance L that is less than the maximum width Wmax.

11. A conductive pattern structure according to claim 10, wherein the slit dummies are arranged in a line and arranged along a direction in which the conductive pattern extends.

12. A conductive pattern structure according to claim 10, wherein the slit dummies are arranged apart at equally spaced distances.

13. A conductive pattern structure according to claim 10, wherein the distance between the slit dummies is approximately $\sqrt{3}/2$ of the maximum width Wmax.

14. A conductive pattern structure according to claim 10, wherein the slit dummies are arranged in a plurality of lines, and wherein the slit dummies in the plurality of lines are arranged in staggered form.

15. A conductive pattern structure according to claim 14, wherein the lines are arranged with a pitch S that is larger than the distance L.

16. A conductive pattern structure according to claim 10, wherein each of the slit dummies has a substantial square form.

17. A conductive pattern structure according to claim 10, wherein a material forming the insulating layer is the same as material forming the slit dummies.

* * * * *